United States Patent
Veerasingam

(10) Patent No.: US 10,121,709 B2
(45) Date of Patent: Nov. 6, 2018

(54) VIRTUAL METROLOGY SYSTEMS AND METHODS FOR USING FEEDFORWARD CRITICAL DIMENSION DATA TO PREDICT OTHER CRITICAL DIMENSIONS OF A WAFER

(71) Applicant: Lam Research Corporation, Fremont, CA (US)

(72) Inventor: Ramanapathy Veerasingam, San Jose, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 114 days.

(21) Appl. No.: 15/413,639

(22) Filed: Jan. 24, 2017

(65) Prior Publication Data

US 2018/0211891 A1    Jul. 26, 2018

(51) Int. Cl.
*G06F 17/50*  (2006.01)
*H01L 21/66*  (2006.01)

(52) U.S. Cl.
CPC .......... *H01L 22/20* (2013.01); *G06F 17/5036* (2013.01); *G06F 17/5081* (2013.01)

(58) Field of Classification Search
USPC ............................. 716/50, 51, 52, 53, 54, 55
See application file for complete search history.

(56) References Cited

U.S. PATENT DOCUMENTS

| | | | | |
|---|---|---|---|---|
| 9,711,420 | B1* | 7/2017 | Lo | ............................ H01L 22/20 |
| 2002/0180948 | A1* | 12/2002 | Grodnensky | ....... G03F 7/70591 355/77 |
| 2008/0035606 | A1* | 2/2008 | Plumhoff | .................. C23F 4/00 216/59 |
| 2008/0311687 | A1* | 12/2008 | Yamashita | ........ H01L 21/32137 438/9 |
| 2009/0296055 | A1* | 12/2009 | Ye | ........................ G03F 7/70266 355/30 |
| 2013/0077101 | A1* | 3/2013 | Sharoni | .................... G03F 1/144 356/625 |
| 2016/0163555 | A1* | 6/2016 | Jang | .................. H01L 21/82345 438/587 |

* cited by examiner

*Primary Examiner* — Brian Ngo

(57) ABSTRACT

A controller includes a memory that stores a first model corresponding to a first critical dimension of a substrate processed by a substrate processing system and a second model corresponding to a second critical dimension of the substrate. The second model includes a predicted relationship between the first critical dimension and the second critical dimension. A critical dimension prediction module calculates a first prediction of the first critical dimension of the substrate using the first model, provides the first prediction of the first critical dimension as an input to the second model, and calculates and outputs a second prediction of the second critical dimension of the substrate using the second model.

19 Claims, 3 Drawing Sheets

VIRTUAL METROLOGY SYSTEMS AND METHODS FOR USING FEEDFORWARD CRITICAL DIMENSION DATA TO PREDICT OTHER CRITICAL DIMENSIONS OF A WAFER

FIELD

The present disclosure relates to substrate processing systems, and more particularly to predicting critical dimensions of a substrate using virtual metrology.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to perform etching, deposition, and/or other treatment of substrates such as semiconductor wafers. Example processes that may be performed on a substrate include, but are not limited to, a plasma enhanced chemical vapor deposition (PECVD) process, a chemically enhanced plasma vapor deposition (CEPVD) process, a sputtering physical vapor deposition (PVD) process, an ion implantation process, and/or other etch (e.g., chemical etch, plasma etch, reactive ion etch, etc.), deposition, and cleaning processes. A substrate may be arranged on a substrate support, such as a pedestal, an electrostatic chuck (ESC), etc. in a processing chamber of the substrate processing system. For example, during etching, a gas mixture including one or more precursors is introduced into the processing chamber and plasma is struck to etch the substrate.

During process steps, process parameters (e.g., temperatures of various components of the system and the substrate, pressure within the processing chamber deposition rates, etch rates, power, etc.) may vary. These variations may have effects on the resulting substrates (e.g., effects on critical dimensions of the substrates).

SUMMARY

A controller includes a memory that stores a first model corresponding to a first critical dimension of a substrate processed by a substrate processing system and a second model corresponding to a second critical dimension of the substrate. The second model includes a predicted relationship between the first critical dimension and the second critical dimension. A critical dimension prediction module calculates a first prediction of the first critical dimension of the substrate using the first model, provides the first prediction of the first critical dimension as an input to the second model, and calculates and outputs a second prediction of the second critical dimension of the substrate using the second model.

A method includes storing a first model corresponding to a first critical dimension of a substrate processed by a substrate processing system and a second model corresponding to a second critical dimension of the substrate. The second model includes a predicted relationship between the first critical dimension and the second critical dimension. The method further includes calculating a first prediction of the first critical dimension of the substrate using the first model, providing the first prediction of the first critical dimension as an input to the second model, and calculating and outputting a second prediction of the second critical dimension of the substrate using the second model.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Figure 1:
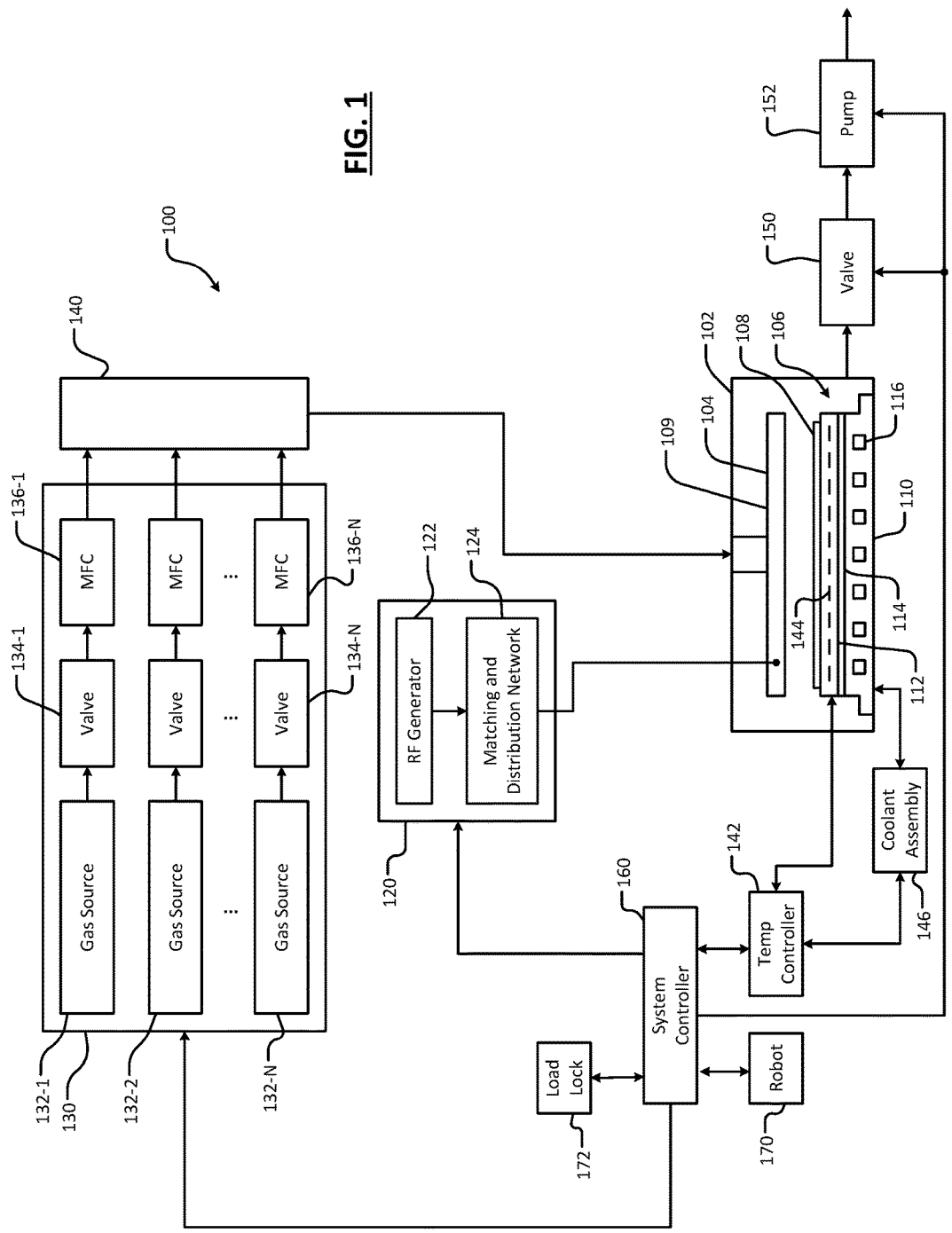
FIG. 1 is a functional block diagram of an example substrate processing system according to the principles of the present disclosure.

Critical dimensions of a semiconductor substrate (i.e., wafer) may be affected by variations in process parameters, processing chamber characteristics, etc. A critical dimension (CD) may refer to substrate metrology metrics such as line width, space width, gate length, hole width, word line width, high aspect ratio hole width (e.g., at any depth or level in a respective hole such as a pillar), hole depth, trench depth, a resistance, etc. Some critical dimensions may be measured subsequent to processing. However, physical measurements of other critical dimensions may be difficult and/or expensive, and, in some cases, may result in destruction of the substrate (e.g., by etching back the substrate to take physical measurements). For example, physical measurements may be difficult to obtain for three dimensional structures, such as in 3D NAND implementations. Accordingly, substrate processing systems may implement various systems and methods for predicting/estimating critical dimensions of a processed substrate.

Virtual metrology systems and methods predict critical dimensions and/or other substrate processing system variables based on tool sensor data, measurement data, and/or other data. For example, virtual metrology systems and methods may implement mathematical models that associate actual measured conditions (e.g., tool sensor data representing in situ measurements taken using respective sensors) to other conditions within the processing chamber, characteristics of the substrate, etc. The models may be periodically updated according to sampled metrology data and feedback data, including, but not limited to, physical measurements taken after processing of the substrate is completed. In this manner, estimation of critical dimensions of substrates processed subsequent to updating the models may be improved.

Virtual metrology systems and methods according to the principles of the present disclosure implement "within wafer" critical dimension prediction of targeted structures using "within wafer" feedforward data. The feedforward data may correspond to virtual metrology model predictions performed for other structures on the same wafer. For example, a first set of critical dimensions of a processed substrate may be predicted using a corresponding virtual metrology model. The predicted first set of critical dimensions may then be used as inputs for predicting a second set of critical dimensions for the same processed substrate. For example, the first set of critical dimensions and the second set of critical dimensions may each be associated with a same feature of the processed substrate. Accordingly, the first set of critical dimensions may be indicative of the second set of critical dimensions for a given substrate. Accordingly, a virtual metrology model corresponding to the second set of critical dimensions may be based in part on a relationship between the first set of critical dimensions and the second set of critical dimensions as described below in more detail.

Referring now to FIG. 1, an example substrate processing system 100 for performing etching using RF plasma is shown. The substrate processing system 100 includes a processing chamber 102 that encloses other components of the substrate processing system 100 and contains the RF plasma. The substrate processing chamber 102 includes an upper electrode 104 and a substrate support, such as an electrostatic chuck (ESC) 106. During operation, a substrate 108 is arranged on the ESC 106.

For example only, the upper electrode 104 may include a showerhead 109 that introduces and distributes process gases. The showerhead 109 may include a stem portion including one end connected to a top surface of the processing chamber. A base portion is generally cylindrical and extends radially outwardly from an opposite end of the stem portion at a location that is spaced from the top surface of the processing chamber. A substrate-facing surface or faceplate of the base portion of the showerhead includes a plurality of holes through which process gas or purge gas flows. Alternately, the upper electrode 104 may include a conducting plate and the process gases may be introduced in another manner.

The ESC 106 includes a conductive baseplate 110 that acts as a lower electrode. The baseplate 110 supports a heating plate 112, which may correspond to a ceramic multi-zone heating plate. A thermal resistance layer 114 may be arranged between the heating plate 112 and the baseplate 110. The baseplate 110 may include one or more coolant channels 116 for flowing coolant through the baseplate 110.

An RF generating system 120 generates and outputs an RF voltage to one of the upper electrode 104 and the lower electrode (e.g., the baseplate 110 of the ESC 106). The other one of the upper electrode 104 and the baseplate 110 may be DC grounded, AC grounded or floating. For example only, the RF generating system 120 may include an RF voltage generator 122 that generates the RF voltage that is fed by a matching and distribution network 124 to the upper electrode 104 or the baseplate 110. In other examples, the plasma may be generated inductively or remotely.

A gas delivery system 130 includes one or more gas sources 132-1, 132-2, . . . , and 132-N (collectively gas sources 132), where N is an integer greater than zero. The gas sources supply one or more precursors and mixtures thereof. The gas sources may also supply purge gas. Vaporized precursor may also be used. The gas sources 132 are connected by valves 134-1, 134-2, . . . , and 134-N (collectively valves 134) and mass flow controllers 136-1, 136-2, . . . , and 136-N (collectively mass flow controllers 136) to a manifold 140. An output of the manifold 140 is fed to the processing chamber 102. For example only, the output of the manifold 140 is fed to the showerhead 109.

A temperature controller 142 may be connected to a plurality of thermal control elements (TCEs) 144 arranged in the heating plate 112. For example, the TCEs 144 may include, but are not limited to, respective macro TCEs corresponding to each zone in a multi-zone heating plate and/or an array of micro TCEs disposed across multiple zones of a multi-zone heating plate as described in more detail in FIGS. 2A and 2B. The temperature controller 142 may be used to control the plurality of TCEs 144 to control a temperature of the ESC 106 and the substrate 108.

The temperature controller 142 may communicate with a coolant assembly 146 to control coolant flow through the channels 116. For example, the coolant assembly 146 may include a coolant pump and reservoir. The temperature controller 142 operates the coolant assembly 146 to selectively flow the coolant through the channels 116 to cool the ESC 106.

A valve 150 and pump 152 may be used to evacuate reactants from the processing chamber 102. A system controller 160 may be used to control components of the substrate processing system 100. A robot 170 may be used to deliver substrates onto, and remove substrates from, the ESC 106. For example, the robot 170 may transfer substrates between the ESC 106 and a load lock 172. Although shown as separate controllers, the temperature controller 142 may be implemented within the system controller 160. The system controller 160 or a separately located virtual metrology controller may implement the virtual metrology systems and methods according to the principles of the present disclosure.

Figure 2A:
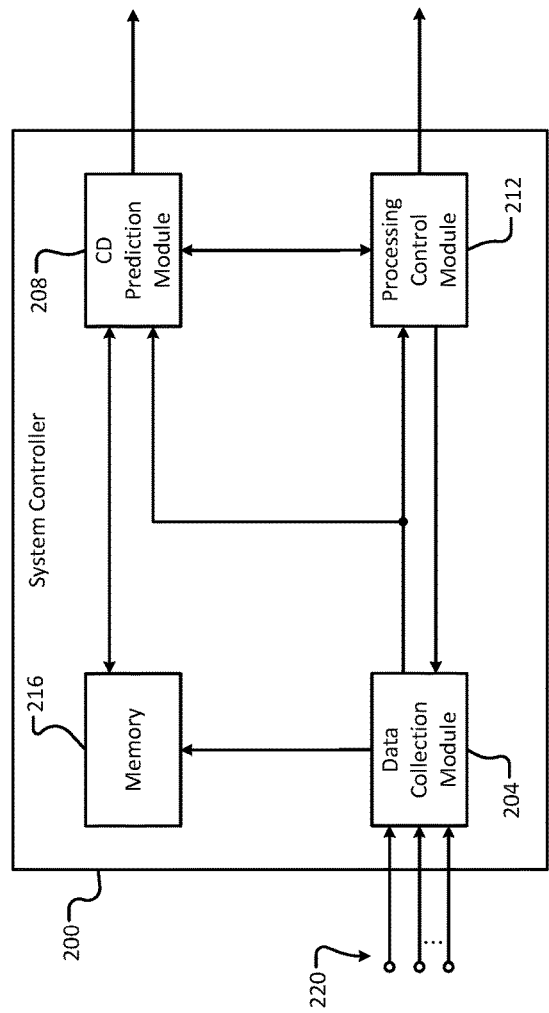
FIG. 2A is a functional block diagram of an example system controller according to the principles of the present disclosure.

Referring now to FIG. 2A, an example system controller 200 includes data collection module 204, critical dimension (CD) prediction module 208, processing control module 212, and memory 216. For example, memory 216 may correspond to non-volatile memory, such as non-volatile semiconductor memory. Memory 216 stores one or more virtual metrology models configured to estimate respective critical dimensions of a substrate based on a plurality of inputs during and/or subsequent to processing.

For example, CD prediction module 208 may be configured to implement the models during and/or subsequent to processing to predict various critical dimensions of the substrate. The CD prediction module 208 executes the models using inputs received from data collection module 204. For example, the data collection module 204 may receive inputs 220 including, but not limited to, physical measurements of the substrate taken prior to processing (e.g., as input by a user), sensor data corresponding to sensor measurements (e.g., gas flow rates, temperature, pressure, RF power, etc.) taken from within the processing chamber 102 during processing, etc. The data collection module 204 may also calculate and/or predict various processing parameters using the inputs 220 (e.g., tool sensor data), inputs from the processing control module 212, etc. For example, the processing control module 212 may be configured to control various parameters associated with substrate processing, including, but not limited to, gas flow rates, power provided to components of the substrate processing system 100, temperatures, etc. The processing control module 212 may provide feedback indicative of the controlled parameters to the data collection module 204.

Accordingly, the CD prediction module 208 retrieves the models stored in the memory 216 and implements the models according to inputs from the data collection module 204, the processing control module 212, etc. The inputs to the models correspond to physical measurements of the substrate being processed, conditions within the processing chamber 102, control parameters associated with the substrate processing system 100, and/or any data incorporated into the models for calculating the critical dimensions of the substrate. The CD prediction module 208 according to the principles of the present disclosure is configured to further provide results of a first model (i.e., corresponding to a first set of predicted critical dimensions) as inputs to a second model. In other words, results of the second model (i.e., corresponding to a second set of predicted critical dimensions) are calculated based in part on the results of the first model.

For example only, the second model may be constructed according to a predicted relationship between a first critical dimension (e.g., corresponding to the first set of critical dimensions) and a second critical dimension (e.g., corresponding to the second set of critical dimensions). The predicted relationship may be calculated according to data collected for a plurality of processed substrates. Critical dimensions of the processed substrates may be measured to determine a relationship between a first critical dimension CDx and a second critical dimension CDy of the same substrate, where CDx may correspond to a critical dimension that may be accurately physically measured subsequent to processing while CDy may correspond to a critical dimension that may not be accurately physically measured subsequent to processing.

In one example, the first critical dimension CDx may correspond to a critical dimension at tops of high aspect ratio structures (e.g. a width between tops of high aspect ratio pillars), which may be physically measurable subsequent to processing. Conversely, the second critical dimension CDy may correspond to a critical dimension at bottoms of the high aspect ratio structures (e.g., a width between bottoms of the high aspect ratio pillars), which may be difficult to physically measure subsequent to processing. Accordingly, the predicted relationship between the first critical dimension CDx and the second critical dimension CDy may be calculated based on processing results of a plurality of substrates by measuring the first critical dimension CDx and the second critical dimension CDy. For example only, the substrate may be etched back to measure the second critical dimension CDy to obtain the measurements for calculating the predicted relationship. The predicted relationship may correspond to an approximately linear or non-linear slope, a derivative, a high-order equation, etc. In another example, the first critical dimension CDx corresponds to a height of a highest high aspect ratio pillar and the second critical dimension CDy corresponds to a height of a lowest high aspect ratio pillar.

In this manner, the CD prediction module 208 calculates a first set of critical dimensions (e.g., CDx-1, CDx-2, . . . , CDx-N) of a substrate using the first model. The calculated first set of critical dimensions are input to the second model, and the CD prediction module 208 calculates a second set of critical dimensions (CDy-1, CDy-2, . . . , CDy-N) of the same substrate using the second model and the first set of critical dimensions. The second model, as previously constructed and stored in the memory 216, incorporates the predicted relationship between the first set of critical dimensions and the second set of critical dimensions.

Physical measurements of the first set of critical dimensions taken subsequent to the processing of the substrate may be compared with the calculated results of the first model to update the second model. For example, since the first set of critical dimensions are indicative of the second set of critical dimensions according to the predicted relationship, it may be presumed that differences (e.g., an offset or delta) between the predictions and actual measurements of the first set of critical dimensions may be indicative of differences between the predictions and actual measurements of the second set of critical dimensions. Accordingly, the differences between the predictions and actual measurements of the first set of critical dimensions may be provided as inputs to the second model to obtain a more accurate prediction of the second set of critical dimensions.

In other examples, the second model may further incorporate predicted relationships between critical dimensions within the first set of critical dimensions. For example, a difference DX1 between CDx-1 and CDx-2 may be indicative of a difference DXY between CDx-1 and CDy-1. As such, a relationship between CDx-1 and CDy-1 may be further defined according to a ratio of DX1 to DXY. In other words, a change in DX1 due to a change in either of CDx-1 or CDx-2 may be used to calculate a corresponding change in CDy-1 by assuming the change in CDy-1 conforms to the ratio DX1 to DXY.

Figure 2B:
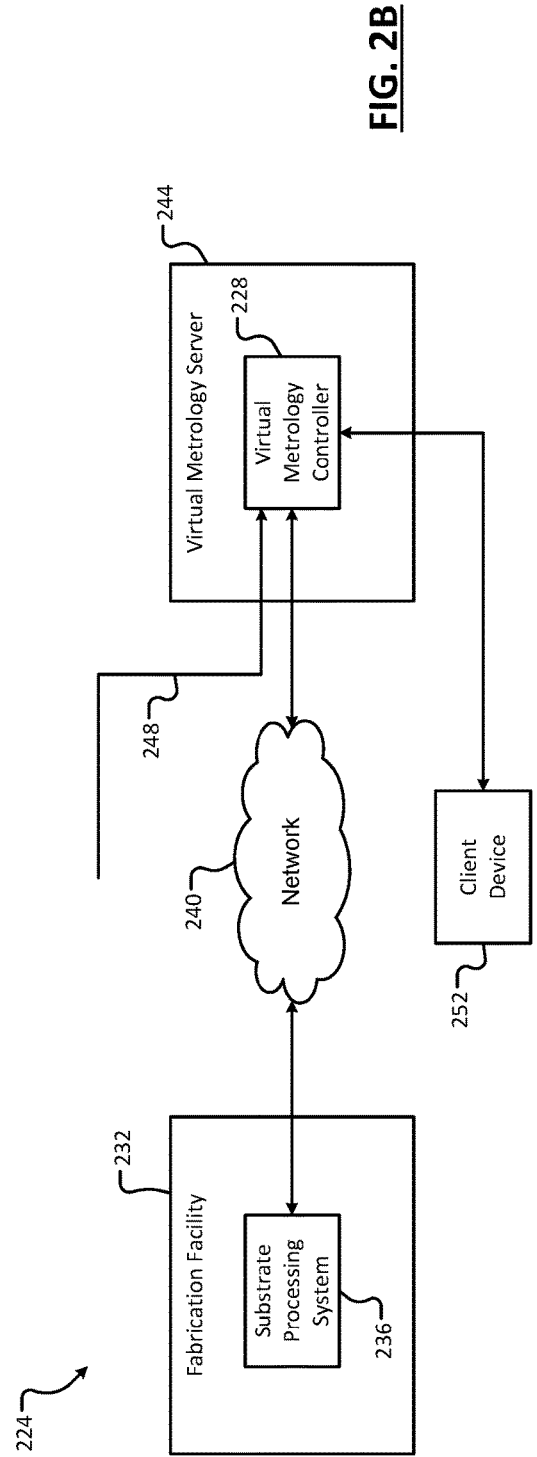
FIG. 2B is a functional block diagram of a virtual metrology system according to the principles of the present disclosure.

Referring now to FIG. 2B, in addition to and/or instead of a local system controller 160/200 as described in FIGS. 1 and 2A, a virtual metrology system 224 may include a remotely located virtual metrology controller 228 implementing the virtual metrology systems and methods described herein. For example, a fabrication facility 232 may include one or more substrate processing systems 236 (e.g., corresponding to the substrate processing system 100 described in FIG. 1). The substrate processing system 236 communicates with the remotely located virtual metrology controller 228 via a network (e.g., a wired or wireless network) 240. A virtual metrology server 244 may implement the virtual metrology controller 228. Although shown outside of the fabrication facility 232, the virtual metrology server 244 may be located within the facility 232 in some examples.

The virtual metrology controller 228 may include components functionally analogous to the memory 216, the CD prediction module 208, the data collection module 204, the processing control module 212, etc. as described in FIG. 2A. Accordingly, the virtual metrology controller 228 is configured to calculate predictions of critical dimensions as described above with respect to FIG. 2A. The virtual metrology controller 224 may receive metrology data, including historical data, from the substrate processing system 236 and/or directly from other sources 248. The other sources 248 may include, but are not limited to, stored historical data, other fabrication facilities, user inputs, etc. A user may access the virtual metrology controller 228 via a client device 252 (e.g., a personal computer, laptop, or other computing device).

Figure 3:
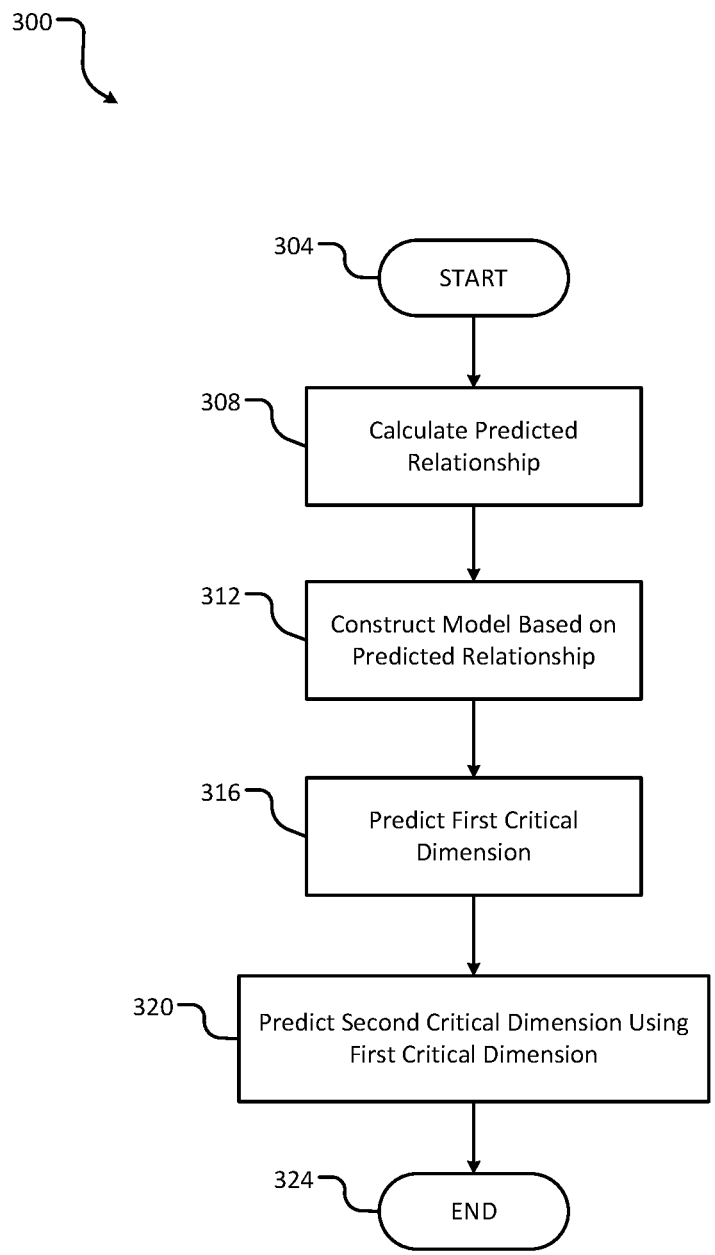
FIG. 3 illustrates steps of a method for predicting critical dimensions of a substrate using feedforward data according to the principles of the present disclosure.

Referring now to FIG. 3, an example method 300 for predicting critical dimensions of a substrate using feedforward data according to the principles of the present disclosure begins at 304. At 308, a predicted relationship between a first critical dimension and a second critical dimension is calculated. For example, the predicted relationship may be calculated according to physical measurements taken of the first critical dimension and the second critical dimension for a plurality of substrates. At 312, a model is constructed based on the predicted relationship. For example, the model corresponds to a virtual metrology model stored in memory and configured to output a prediction of the second critical dimension using a prediction of the first critical dimension as one of a plurality of inputs.

At 316, the method 300 (e.g., the CD prediction module 208) calculates a prediction of the first critical dimension. For example, the method 300 receives one or more inputs related to the processing of the substrate and implements a virtual metrology model associated with the first critical dimension. At 320, the method 300 (e.g., the CD prediction module 208) calculates, using the model based on the predicted relationship between the first critical dimension and the second critical dimension, a prediction of the second critical dimension. For example, the CD prediction module 208 uses the prediction of the first critical dimension as one of a plurality of inputs to the model. The method 300 ends at 324.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A controller, comprising:
a memory that stores (i) a first model corresponding to a first critical dimension of a substrate processed by a substrate processing system and (ii) a second model corresponding to a second critical dimension of the substrate, wherein the second model includes a predicted relationship between the first critical dimension and the second critical dimension; and
a critical dimension prediction module that (i) calculates a first prediction of the first critical dimension of the substrate using the first model, (ii) provides the first prediction of the first critical dimension as an input to the second model, and (iii) calculates and outputs a second prediction of the second critical dimension of the substrate using the second model.

2. The controller of claim 1, wherein at least one of the first model and the second model corresponds to a virtual metrology model.

3. The controller of claim 1, wherein the first critical dimension and the second critical dimension are associated with a same feature of the substrate.

4. The controller of claim 1, wherein the first critical dimension and the second critical dimension correspond to a height of a high aspect ratio structure on the substrate.

5. The controller of claim 1, wherein the first critical dimension and the second critical dimension correspond to a width between high aspect ratio structures on the substrate.

6. The controller of claim 1, wherein the critical dimension prediction module updates the second model based on a comparison between the first prediction of the first critical dimension and a measurement of the first critical dimension.

7. The controller of claim 1, wherein the predicted relationship is based on respective measurements of the first critical dimension and the second critical dimension on a plurality of substrates.

8. The controller of claim 1, wherein the predicted relationship is based on a ratio of (i) a difference between the first critical dimension and a third critical dimension to (ii) a difference between the first critical dimension and the second critical dimension.

9. The controller of claim 1, wherein the predicted relationship corresponds to a linear or a non-linear relationship between the first critical dimension and the second critical dimension.

10. A system, comprising:
the controller of claim 1; and
the substrate processing system, wherein the controller is remotely located from the substrate processing system.

11. A method, comprising:
storing (i) a first model corresponding to a first critical dimension of a substrate processed by a substrate processing system and (ii) a second model corresponding to a second critical dimension of the substrate, wherein the second model includes a predicted relationship between the first critical dimension and the second critical dimension;
calculating a first prediction of the first critical dimension of the substrate using the first model;
providing the first prediction of the first critical dimension as an input to the second model; and
calculating and outputting a second prediction of the second critical dimension of the substrate using the second model.

12. The method of claim 11, wherein at least one of the first model and the second model corresponds to a virtual metrology model.

13. The method of claim 11, wherein the first critical dimension and the second critical dimension are associated with a same feature of the substrate.

14. The method of claim 11, wherein the first critical dimension and the second critical dimension correspond to a height of a high aspect ratio structure on the substrate.

15. The method of claim 11, wherein the first critical dimension and the second critical dimension correspond to a width between high aspect ratio structures on the substrate.

16. The method of claim 11, further comprising updating the second model based on a comparison between the first prediction of the first critical dimension and a measurement of the first critical dimension.

17. The method of claim 11, wherein the predicted relationship is based on respective measurements of the first critical dimension and the second critical dimension on a plurality of substrates.

18. The method of claim 11, wherein the predicted relationship is based on a ratio of (i) a difference between the first critical dimension and a third critical dimension to (ii) a difference between the first critical dimension and the second critical dimension.

19. The method of claim 11, wherein the predicted relationship corresponds to a linear or a non-linear relationship between the first critical dimension and the second critical dimension.

* * * * *